(12) United States Patent
Chun et al.

(10) Patent No.: US 6,191,053 B1
(45) Date of Patent: Feb. 20, 2001

(54) HIGH EFFICIENCY PHOTORESIST COATING

(75) Inventors: Jung-Hoon Chun, Sudbury, MA (US); James Derksen, West Chicago, IL (US); Sangjun Han, Cambridge, MA (US)

(73) Assignee: Silicon Valley Group, Inc., San Jose, CA (US)

( * ) Notice: Under 35 U.S.C. 154(b), the term of this patent shall be extended for 0 days.

(21) Appl. No.: 09/094,443

(22) Filed: Jun. 10, 1998

Related U.S. Application Data

(60) Provisional application No. 60/050,017, filed on Jun. 16, 1997, provisional application No. 60/050,159, filed on Jun. 19, 1997, and provisional application No. 60/055,789, filed on Aug. 14, 1997.

(51) Int. Cl.$^7$ .................................................. H01L 21/312

(52) U.S. Cl. ...................... 438/780; 438/782; 427/240; 427/346; 118/320; 430/270.1

(58) Field of Search .................................... 427/240, 346; 118/320; 438/725, 694, 778, 782, 780; 430/270.1

(56) References Cited

U.S. PATENT DOCUMENTS

| | | | |
|---|---|---|---|
| 2,681,234 | 6/1954 | Lee | 280/96 |
| 3,198,657 | * 8/1965 | Kimball et al. | 117/101 |
| 4,551,355 | * 11/1985 | Ericson et al. | 427/48 |
| 5,094,884 | * 3/1992 | Hillman et al. | 427/240 |
| 5,358,740 | * 10/1994 | Bornside et al. | 427/240 |
| 5,395,803 | * 3/1995 | Adams | 437/229 |
| 5,532,192 | 7/1996 | Adams | 437/229 |
| 5,985,363 | * 11/1999 | Shiau et al. | 427/240 |

FOREIGN PATENT DOCUMENTS

| | | | |
|---|---|---|---|
| 63-301520 | 5/1987 | (JP) | H01L/21/30 |
| 3-22428 | 6/1989 | (JP) | H01L/21/300 |
| 4-332116 | 5/1991 | (JP) | H01L/21/027 |
| 8-168715 | 12/1994 | (JP) | B05C/11/08 |

OTHER PUBLICATIONS

Bagen et al, Extrusion Coating of Polymer Films for Low–Cost Flat Panel Display Manufacturing, 1996 Display Manufacturing Technology Conference, Digest of Technical Papers, pp. 35–36 (1996).

Cohen et al, Modern Coating and Drying Technology, VCH Publishers, Inc., Chaper 4, pp. 117–167(1992).

W. Mues et al, Observation of a Dynamic Wetting Process Using Laser–Doppler Velocimetry, AIChE Journal, vol. 35, No. 9, pp. 1521–1526 (Sep. 1989).

Edgar B. Gutoff, Simplified Design of Coating Die Internals, Journal of Imaging Science and Technology, vol. 37, No. 6, pp. 615–627, (Dec. 1993).

(List continued on next page.)

*Primary Examiner*—Janet Baxter
*Assistant Examiner*—Barbara Gilmore
(74) *Attorney, Agent, or Firm*—Wilson Sonsini Goodrich & Rosati

(57) ABSTRACT

An improved method and apparatus for coating semiconductor substrates with organic photoresist polymers by extruding a ribbon of photoresist in a spiral pattern which covers the entire top surface of the wafer. The invention provides a more uniform photoresist layer and is much more efficient than are current methods in the use of expensive photoresist solutions. A wafer is mounted on a chuck, aligned horizontally and oriented upward. An extrusion head is positioned adjacent to the outer edge of the wafer and above the top surface of the wafer with an extrusion slot aligned radially with respect to the wafer. The wafer is rotated and the extrusion head moved radially toward the center of the wafer while photoresist is extruded out the extrusion slot. The rotation rate of the wafer and the radial speed of the extrusion head are controlled so that the tangential velocity of the extrusion head with respect to the rotating wafer is a constant.

12 Claims, 7 Drawing Sheets

OTHER PUBLICATIONS

Edgar B. Gutoff et al, Coating and Drying Defects, John Wiley & Sons, New York, Chapter 5, pp. 96–138, (1992).

B. G. Higgins et al, Capillary Pressure and Viscous Pressure Drop Set Bounds on Coating Bead Operability, Chemical Engineering Science, vol. 35, pp. 673–682, (1980).

Kwong–Yang Lee et al, Minimum Wet Thickness in Extrusion Slot Coating, Chemical Engineering Science, vol. 47, No. 7, pp. 1703–1713, (1992).

Kenneth J. Ruschak, Limiting Flow in a Pre–Metered Coating Device, Chemical Engineering Science, vol. 31, pp. 1057–1060, (1976).

Alfred G. Emslie et al, Flow of a Viscous Liquid on a Rotating Disk, Journal of Applied Physics, vol. 29, No. 5, pp. 858–862, (May 1958).

Peter C. Sukanek, Spin Coating, Journal of Imaging Technology, vol. 11, No. 4, pp. 184–190, (Aug. 1985).

B. Hafizi, Effects of Carrier and Dispersion on Propagation of a Directed Electromagnetic Pulse, Journal of Applied Physics, vol. 73, No. 2, pp. 513–521 (Jan. 1993).

D. E. Bornside et al, On the Modeling of Spin Coating, Journal of Imaging Technology, vol. 13, No. 4, pp. 122–130, (Aug. 1987).

Dietrich Meyerhofer, Characteristics of Resist Films Produced by Spinning, Journal of Applied Physics, vol. 49, No. 7, pp. 3993–3997, (Jul. 1978).

Nathalie Fraysse et al, An Experimental Study of Rivulet Instabilities in Centrifugal Spin Coating of Viscous Newtonian and Non–Newtonian Fluids, Physics of Fluids, vol. 6, No. 4, pp. 1491–1504, (Apr. 1994).

C.J. Lawrence, The Mechanics of Spin Coating of Polymer Films, Physics of Fluids, vol. 31, No. 10, pp. 2786–2795 (Oct. 1988).

Sartor, Luigi, "Slot Coating: Fluid Mechanics and Die Design", PhD Dissertation submitted to the University of Minnesota, Sep. 1990.

\* cited by examiner

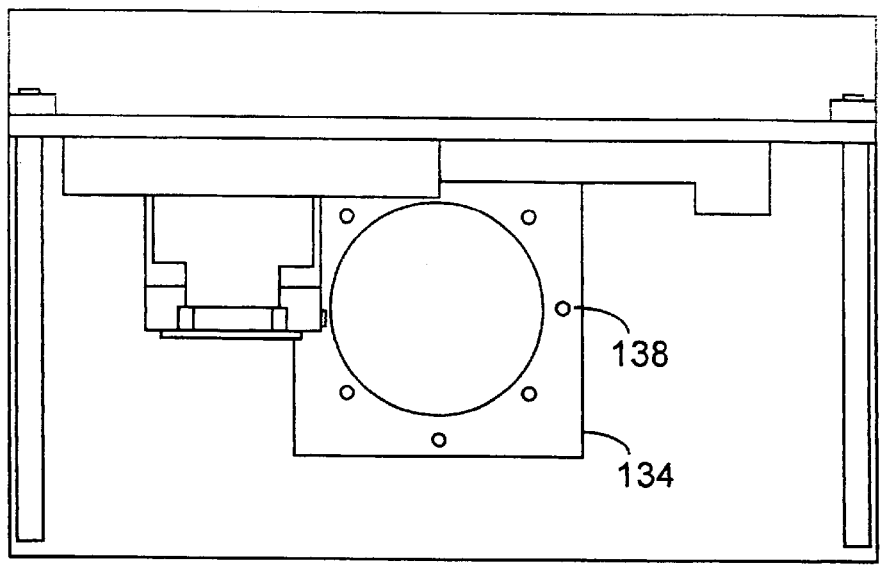
FIG. 13
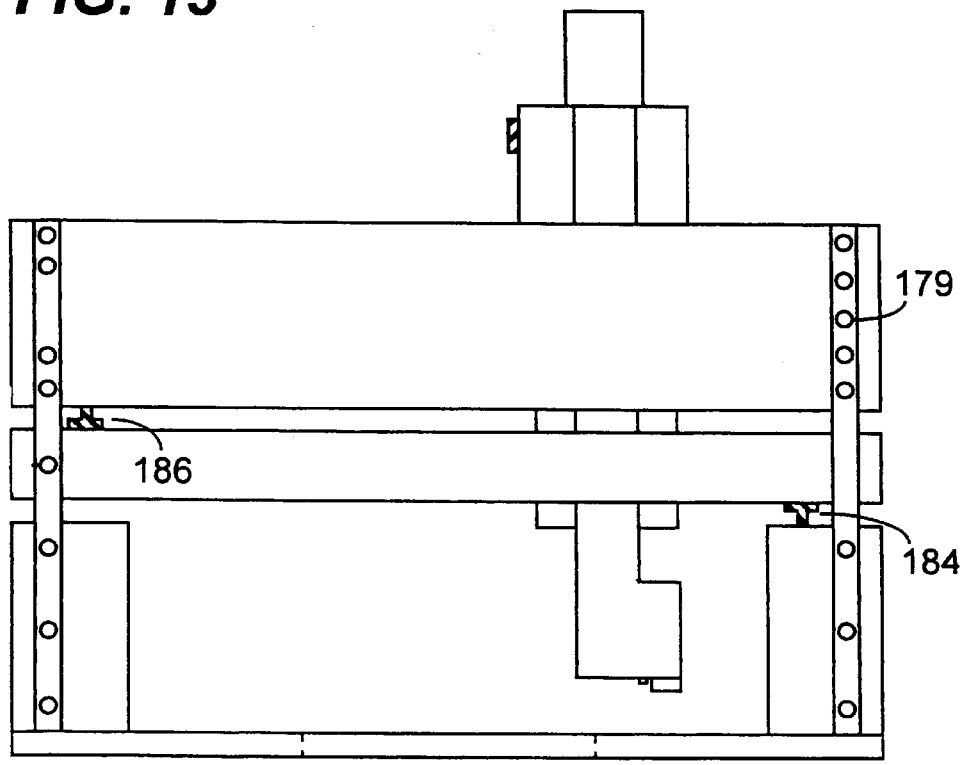
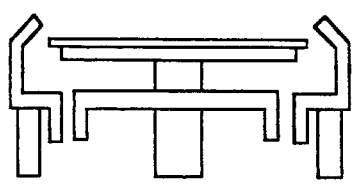
FIG. 14

HIGH EFFICIENCY PHOTORESIST COATING

CROSS REFERENCE TO RELATED APPLICATIONS

This application claims priority from our copending provisional U.S. patent application Ser. No. 60/050,017, filed Jun. 16, 1997; Ser. No. 60/050,159, filed Jun. 19, 1997; and Ser. No. 60/055,789, filed Aug. 14, 1997.

FIELD OF THE INVENTION

This invention relates to an improved method and apparatus for coating semiconductor substrates with organic photoresist polymers. In particular, this invention relates to an improved method and apparatus for coating semiconductor substrates which provides a more uniform photoresist layer and is much more efficient than are current methods in the use of expensive photoresist solutions.

BACKGROUND OF THE INVENTION

The manufacture of integrated circuits involves the transfer of geometric shapes on a mask to the surface of a semiconductor wafer. Thereafter, the semiconductor wafer corresponding to the geometric shapes, or corresponding to the areas between the geometric shapes, is etched away. The transfer of the shapes from the mask to the semiconductor wafer typically involves a lithographic process. This includes applying a solution of a pre-polymer solution to the semiconductor wafer, the pre-polymer being selected to form a radiation-sensitive polymer which reacts when exposed to ultraviolet light, electron beams, x-rays, or ion beams, for example. The solvent in the pre-polymer solution is removed by evaporation, and the resulting polymer film is then baked. The film is exposed to radiation, for example, ultraviolet light, through a photomask supporting the desired geometric patterns. The images in the photosensitive material are then developed by soaking the wafer in a developing solution. The exposed or unexposed areas are removed in the developing process, depending on the nature of the radiation-sensitive material. Thereafter, the wafer is placed in an etching environment which etches away the areas not protected by the radiation-sensitive material. Due to their resistance to the etching process, the radiation sensitive-materials are also known as photoresists, and the term photoresist is used hereinafter to denote the radiation-sensitive polymers and their pre-polymers.

The photoresist film thickness required depends on the desired resolution, defect protection, and step coverage. Thicker films provide better adhesion, greater protection for reactive ion erosion, and improved defect protection. However, thicker films also result in lower resolution because they take longer to expose and develop. Photoresist film thicknesses used in current semiconductor manufacturing may be typically 0.5 to 4 $\mu$m thick.

Thickness uniformity of the photoresist layer is an important criterion in the manufacture of integrated circuits. When the radiation is focused through the mask onto the coating, variations in thickness of the coating prevent the precise focus over the entire surface of the wafer which is required to obtain the sharpness necessary to ensure satisfactory reproduction of the geometric patterns on the semiconductor wafer for advanced circuits with line width dimensions approaching 0.25 $\mu$m line widths and smaller over a surface. Photoresist film thickness uniformity is required to maintain good transfer of the mask pattern to the photoresist. Uniformity is important to maintain a constant exposure level across the surface of the wafer. Nonuniformities cause position overlay errors when optical steppers attempt to sense alignment marks beneath the photoresist film. Non-uniformities also change the reflectivity of a photoresist deposited over an oxide.

The small critical dimensions of microelectronic devices require photoresist coating thickness typically to be uniform to within 10 Å ($3\sigma$). As the critical dimension decreases further, even better uniformities will be required.

The high cost of the photoresist pre-polymer solutions makes it desirable to devise methods of improving the efficiency of the coating process so as to minimize the amount of the polymer solution required to coat a substrate.

Methods which have been used or proposed for coating wafers include dip coating, meniscus coating, spray coating, patch coating, bubble coating, chemical vapor deposition, and spin coating. Only a few of these methods produce photoresist films with the thicknesses and uniformities required for semiconductor production. Of these methods, only spin coating has a production rate fast enough to meet the demands of chip manufacturers. One major shortcoming of spin coating, however, is that it can waste as much as 90%, or more, of the photoresist applied to the wafer surface.

About one million gallons of photoresist are consumed each year at a cost of several hundred million dollars. As the critical dimension of semiconductor devices becomes smaller, new deep UV photoresists will be used. These new photoresists can cost five or more times the cost of the i-line photoresists used currently. Therefore, a new coating method is needed which wastes less photoresist while producing uniform, defect-free coatings at a rate comparable to that of spin coating.

OBJECTS AND SUMMARY OF THE INVENTION

One object of this invention is to provide an improved wafer coating process and apparatus which provide greater coating uniformity across the entire surface of the wafer.

Another object of the invention is to provide an improved wafer coating process and apparatus which provide coating uniformity with less waste and more efficient use of the photoresist.

In a first aspect the invention provides a method of applying a coating of photoresist to a circular semiconductor wafer, the wafer having a top surface, a center, and an outer edge, the method comprising extruding a ribbon of photoresist, the ribbon having a width bounded by outer and inner sides, the ribbon extruded in a spiral pattern which covers the entire top surface of the wafer.

In a second aspect, the invention provides a method of applying a coating of photoresist to a circular semiconductor wafer, the wafer having a top surface, a center, a diameter, and an outer edge, the method comprising the steps of mounting the wafer on a chuck, the top surface of the wafer aligned horizontally and oriented upward; positioning an extrusion head adjacent to the outer edge of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the first end of the extrusion slot located adjacent to the outer edge of the wafer, and the second end of the extrusion slot outside the outer edge of the wafer; rotating the wafer about its center;

extruding a ribbon of photoresist from the extrusion slot, the ribbon having a width bounded by outer and inner sides, the width of the ribbon substantially equal to the length of the slot; and, while extruding photoresist from the extrusion slot, and maintaining the extrusion slot aligned radially with respect to the wafer, moving the extrusion head radially inward from the outer edge of the wafer toward the center of the wafer until the photoresist covers the entire top surface of the wafer.

In a third aspect, the invention provides a method of applying a coating of photoresist to a circular semiconductor wafer, the wafer having a top surface, a center, a diameter, and an outer edge, the method comprising the steps of mounting the wafer on a chuck; positioning an extrusion head at the center of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the second end of the extrusion slot located at the center of the wafer and the first end of the extrusion slot located between the center of the wafer and the outer edge of the wafer; rotating the wafer about its center; extruding a ribbon of photoresist from the extrusion slot, the ribbon having a width substantially equal to the length of the slot; and, while extruding photoresist from the extrusion slot, and maintaining the extrusion slot aligned radially with respect to the wafer, moving the extrusion head radially outward toward the outer edge of the wafer until the second end of the extrusion slot reaches the outer edge of the wafer.

In a fourth aspect, the invention provides an apparatus for applying a coating of photoresist to a circular semiconductor wafer, the wafer having a top surface, a center, a diameter, and an outer edge, the apparatus comprising means for mounting a wafer with the top surface of the wafer aligned horizontally and oriented upward; an extrusion head positioned adjacent to the outer edge of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the first end of the extrusion slot located adjacent to the outer edge of the wafer, and the second end of the extrusion slot outside the outer edge of the wafer; means for rotating the wafer about its center; means for extruding a ribbon of photoresist from the extrusion slot, the ribbon having a width substantially equal to the length of the slot; and means for, while extruding photoresist from the extrusion slot, and maintaining the extrusion slot aligned radially with respect to the wafer, moving the extrusion head radially inward toward the center of the wafer until the photoresist covers the entire top surface of the wafer.

BRIEF DESCRIPTION OF THE DRAWINGS

FIGS. 12, 13 and 14 are a front view, top view and rear view, respectively of an extrusion spin coating assembly of the invention.

DETAILED DESCRIPTION OF THE INVENTION

Figure 1:
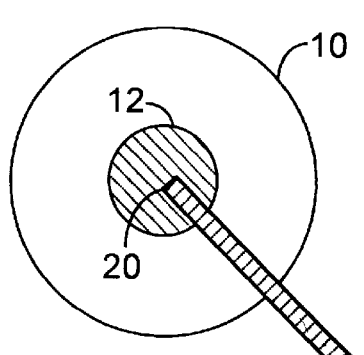
FIG. 1 illustrates a static dispense method employed to dispense photoresist on a wafer surface in a spin coating process.
Figure 2:
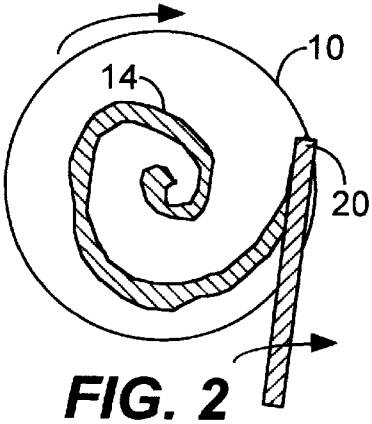
FIG. 2 illustrates a forward radial dynamic dispense method employed to dispense photoresist on a wafer surface in a spin coating process.
Figure 3:
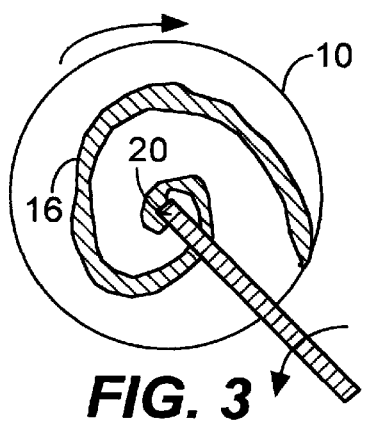
FIG. 3 illustrates a reverse radial dynamic dispense method employed to dispense photoresist on a wafer surface in a spin coating process.

FIGS. 1, 2 and 3 shows three primary methods currently employed to dispense photoresist on a wafer surface in a spin coating process. The method depicted in FIG. 1 is referred to as "static dispense." In static dispense, the photoresist is dispensed directly from dispense nozzle 20 into the center of a stationary wafer 10, producing a circular pool of photoresist 12. Alternatively, the entire surface of the wafer 10 may be flooded with photoresist. Often, the wafer 10 is rotated slowly after a static dispense to begin spreading the photoresist 12 over the wafer 10 surface.

The methods illustrated in FIGS. 2 and 3 are referred to as "dynamic dispenses," because the wafer 10 is rotating slowly while the photoresist 14, 16 is dispensed. During forward radial dispense, illustrated in FIG. 2, the dispense nozzle 20 is initially located at the center of the wafer 10 and moves radially outward as the photoresist 14 is deposited. For reverse radial dispense, illustrated in FIG. 3, the dispense nozzle begins at the outer edge of the wafer and moves radially inward. In both FIGS. 2 and 3 the dispense nozzle 20 is illustrated at the end of travel after having deposited photoresist on the slowly spinning wafer 10. Both forward and reverse radial dispense produce a spiral pattern 14, 16 of photoresist. The geometry of the spiral 14, 16, i.e. number of turns of the spiral and volume of photoresist per unit length along the spiral, is determined by the angular rotation of the wafer 10, the radial velocity of the nozzle 20 with respect to the wafer 10, and the volumetric flow of the photoresist during the dispense. Dynamic dispenses use less photoresist, but static dispenses produce a more uniform film.

After the photoresist is deposited on the wafer, the wafer is accelerated to create a centrifugal force which spreads the photoresist toward the edge of the wafer. The wafer may be spun at an intermediate speed for a few seconds before being accelerated to the final high-speed spin. When the bulk of the photoresist reaches the edge of the wafer, most of the photoresist is flung off in many tiny droplets. It has been shown that while the acceleration rate does not affect the final film thickness, higher acceleration rates do tend to produce more uniform films.

Once the wafer is spun up to the final high speed, the wafer continues to spin to cause the photoresist to reach the desired thickness. Photoresist continues to flow outward and off the wafer in concentric waves. Simultaneously, the solvent in the photoresist evaporates quickly because of high convection over the wafer surface. As the solvent fraction in the photoresist decreases, the viscosity of the photoresist gradually increases, causing the outward flow of photoresist to diminish until it almost ceases. Subsequent thinning of the photoresist comes almost entirely from solvent evaporation. When the solvent is mostly evaporated, typically after about 30 seconds, spinning is stopped, and the wafer is soft baked at a high temperature to evaporate the remaining solvent from the photoresist.

In each of the dispense methods depicted in FIGS. 1, 2 and 3, the photoresist is dispensed onto the wafer in a thick puddle or ribbon, and must be spread by some means, e.g. slow spin, to spread the photoresist to cover the wafer and to reduce the photoresist to a thin layer. In the method of the invention, the photoresist is applied in a thin uniform layer over the entire surface of the wafer. This eliminates the need for the slow spin step, and requires less photoresist to be deposited on the wafer to achieve the desired final thickness and uniformity.

The method of the invention employs extrusion slot coating to dispense a thin ribbon of photoresist over the entire surface of the wafer. Extrusion slot coating is a member of the class of pre-metered coating methods. With extrusion slot coating, the coating thickness can be controlled by the photoresist dispense rate, the efficiency can be near 100%, and the thickness uniformity is very good.

Figure 4:
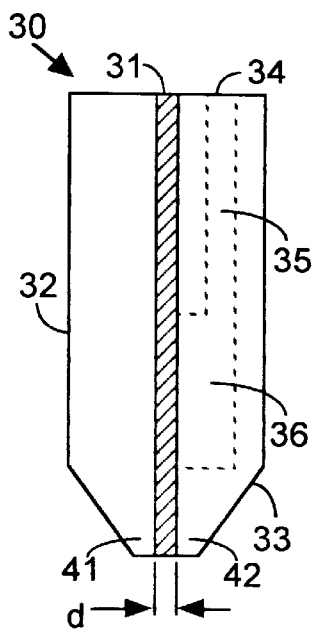
FIG. 4 is an assembly drawing of a side view of an extrusion head of the invention.
Figure 5:
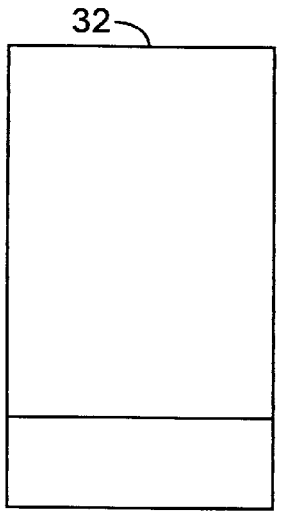
FIG. 5 is a front view of a front plate of an extrusion head of the invention.
Figure 6:
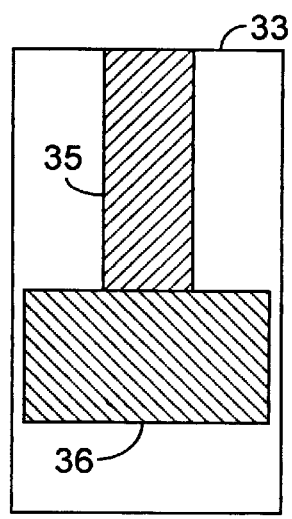
FIG. 6 is a front view of a rear plate of an extrusion head of the invention.
Figure 7:
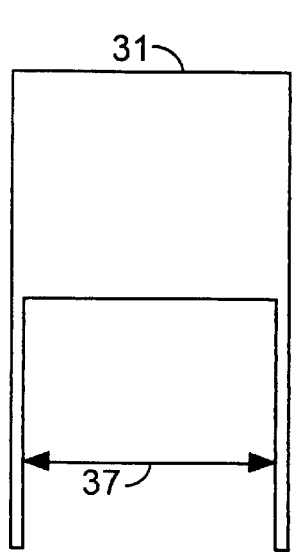
FIG. 7 is a front view of a shim of an extrusion head of the invention.
Figure 8:
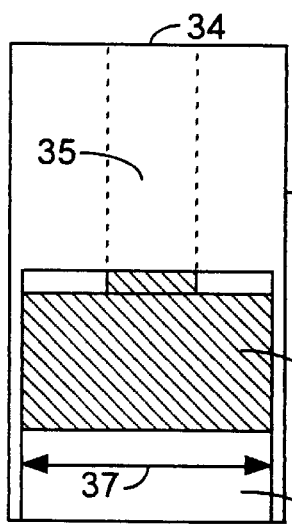
FIG. 8 is a front view of a shim against a back plate.

In extrusion slot coating, the photoresist is extruded onto the wafer through a narrow slot. FIGS. 4–11 illustrate an embodiment of an extrusion head 30 which may be used in the invention. The extrusion head 30 may also be referred to as an extrusion die. FIG. 4 shows a side assembly view of the extrusion head 30 which is constructed of a stainless steel U-shaped shim 31 sandwiched between a stainless steel front plate 32 and a stainless steel back plate 33. FIGS. 5, 6 and 7 show a front view of the front plate 32, back plate 33, and shim 31, respectively. FIG. 8 shows a front view of the shim 31 against the back plate 33. Referring to FIG. 4, the front plate 32 and back plate 33 are grounded and polished on their inner edges, facing the shim 31, to provide good seal with the shim 31 and a smooth surface for extrusion. Photoresist enters the extrusion head 30 through a port 34 in the top of the back plate 33. The port 34 directs the photoresist through a tube 35 to a flow channel 36 (FIGS. 4, 6). The flow channel 36 is as wide as the opening of the "U" of the shim 31 (FIGS. 7, 8).

Figure 9:
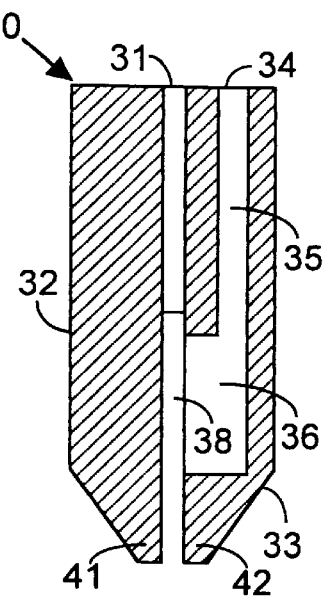
FIG. 9 is a cross sectional view of an assembled extrusion head of the invention.

FIG. 9 is a sectional view of the extrusion head 30 illustrated in FIG. 4. The void created by the u-shape of the shim 31 leaves a narrow gap 38 between the front plate 32 and back plate 33 through which photoresist can flow. At the base of the extrusion head 30, the gap 38 continues downward between two narrow "lips" 41, 42 which extend the inner surface of the front plate 32 and back plate 33.

Figure 10:
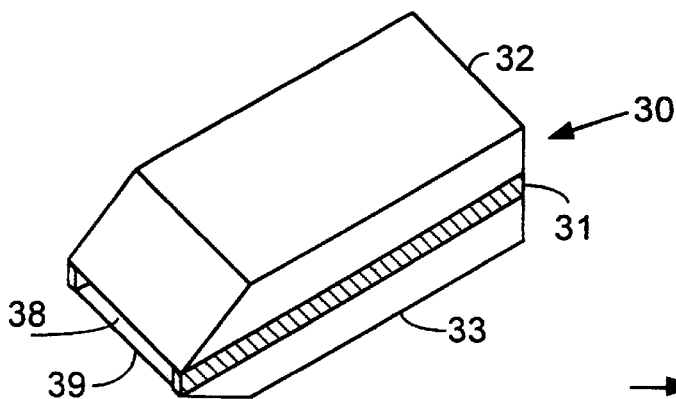
FIG. 10 is a perspective view of an assembled extrusion head of the invention.

FIG. 10 is a perspective view of the extrusion head illustrated in FIG. 4. The gap 38 extends across the opening of the "U" 37 (FIGS. 7, 8) of the shim 31 to form an extrusion slot 39 in the extrusion head 30.

Figure 11:
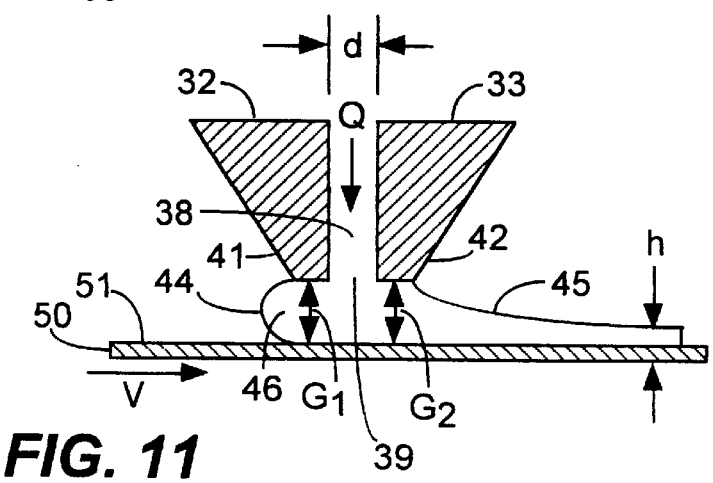
FIG. 11 is a cross sectional view of the lips of an extrusion head with a substrate moving beneath the lips of the extrusion head.

FIG. 11 is a cross sectional view of the lips 41, 42 of an extrusion head 30 with a substrate 50 moving beneath the extrusion lips 41, 42. Photoresist is extruded out the slot 39 at the base of the lips 41, 42 onto the top surface 51 of the substrate 50. The width of the gap 38 between the front plate 32 and rear plate 33, indicated as d, is equal to the thickness of the shim 31 (FIGS. 4, 9). The coating gap between the lips 41, 42 and the substrate 50 is filled with a bead 46 of coating fluid coming from the slot 39. When the substrate 50 is moved perpendicular to the slot 39, keeping the coating gap constant, fluid is drawn out of the bead 46 and remains as a thin film on the substrate 50. The width of the extruded film, w (FIGS. 19, 20) is approximately equal to the length of the extrusion slot 39, i.e. the opening of the "U" of the shim 31 (FIGS. 7, 8). The average thickness of the extruded film, h, is $$h = \frac{Q}{wv}$$

where v is the coating speed, and Q is the fluid dispense rate. The menisci 44, 45 at the leading and trailing edges of the coating bead 46 are pinned to the corners of the extrusion head lips 41, 42. The corners of the extrusion head lips 41, 42 should have a radius of curvature less than approximately 50 $\mu$m to keep the menisci 44, 45 pinned. The capillary, viscous, and inlet pressures in the coating bead 46 must balance the external pressure to maintain stability in the coating bead 46. A slight vacuum at the leading edge of the coating bead 46 can be used to stabilize the coating bead 46 when coating thinner films or at higher coating speeds. The extrusion head lips 41, 42 are normally of equal length ($G_1=G_2$) and the extrusion head 30 is perpendicular to the substrate 50. For very thin coatings, however, it is sometimes beneficial to have one of the lips extend beyond the other ($G_1 \neq G_2$) or to have the extrusion head 30 slightly tilted from perpendicular to the substrate 50, thereby tilting the coating slot 39 with respect to the substrate 50.

Figure 12:
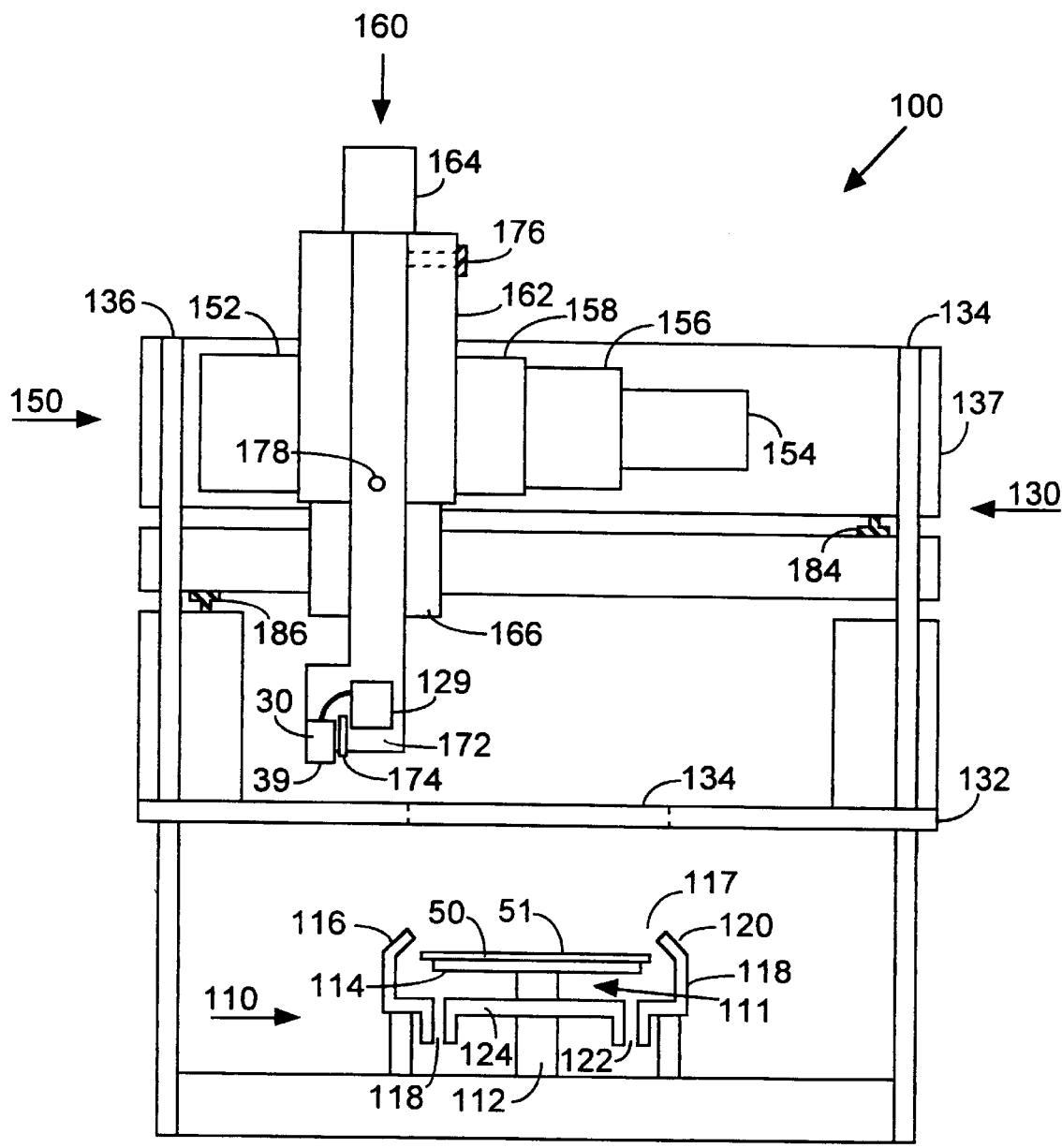

The description of the extrusion spin coating assembly 100 will be with reference to FIGS. 12, 13 and 14, which illustrate front, top and rear views, respectively, of an extrusion spin coating assembly 100 according to the invention. Components of the extrusion spin coating assembly 100 illustrated in FIGS. 12, 13 and 14 include a coating module 110 and a positioning system 130. Not illustrated in FIGS. 12, 13 and 14, but described with reference to FIG. 15, is a control system 210 which includes a positioning controller 220 and a spinner controller 280.

The coating module 110 includes a spinner assembly 111 which includes a spinner servomotor (not illustrated, reference numeral 113 in FIG. 15) connected to a vertical shaft 112. The vertical shaft 112 supports a Teflon vacuum chuck 114. The spinner assembly 111 can be moved vertically using a chuck elevator servomotor (not illustrated, reference numeral 115 in FIG. 15). The chuck elevator servomotor is equipped with an elevator motor brake (not illustrated, reference numeral 135 in FIG. 15). With the spinner assembly 111 at its lowest position, the chuck 114 is surrounded by a catch cup 116 (sectional view illustrated). The catch cup 116 is a circular cup having an open top 117. The upper portion 120 of the cup wall 118 tilts inward to facilitate retaining waste photoresist within the catch cup 116. The catch cup 116 serves three purposes. The catch cup 116 catches and drains waste photoresist out a liquid waste drain 122. The catch cup has an exhaust vent 118 through which evaporated solvent is removed. The catch cup 116 directs the flow of air over a spinning wafer to avoid turbulence. Both the exhaust vent 118 and waste drain 122 exit the bottom 124 of the catch cup 116. Means for removing waste photoresist and exhausted vapors are well known to those skilled in the art and are therefore not illustrated.

The spinner assembly 111 has a centering device including eight Teflon pins 138 for centering wafers on the chuck 114, and three vertical pins (not illustrated) for supporting loose wafers before and after processing. The centering pins 138 are controlled by a centering solenoid (not illustrated, reference numeral 119 in FIG. 15).

Figure 15:
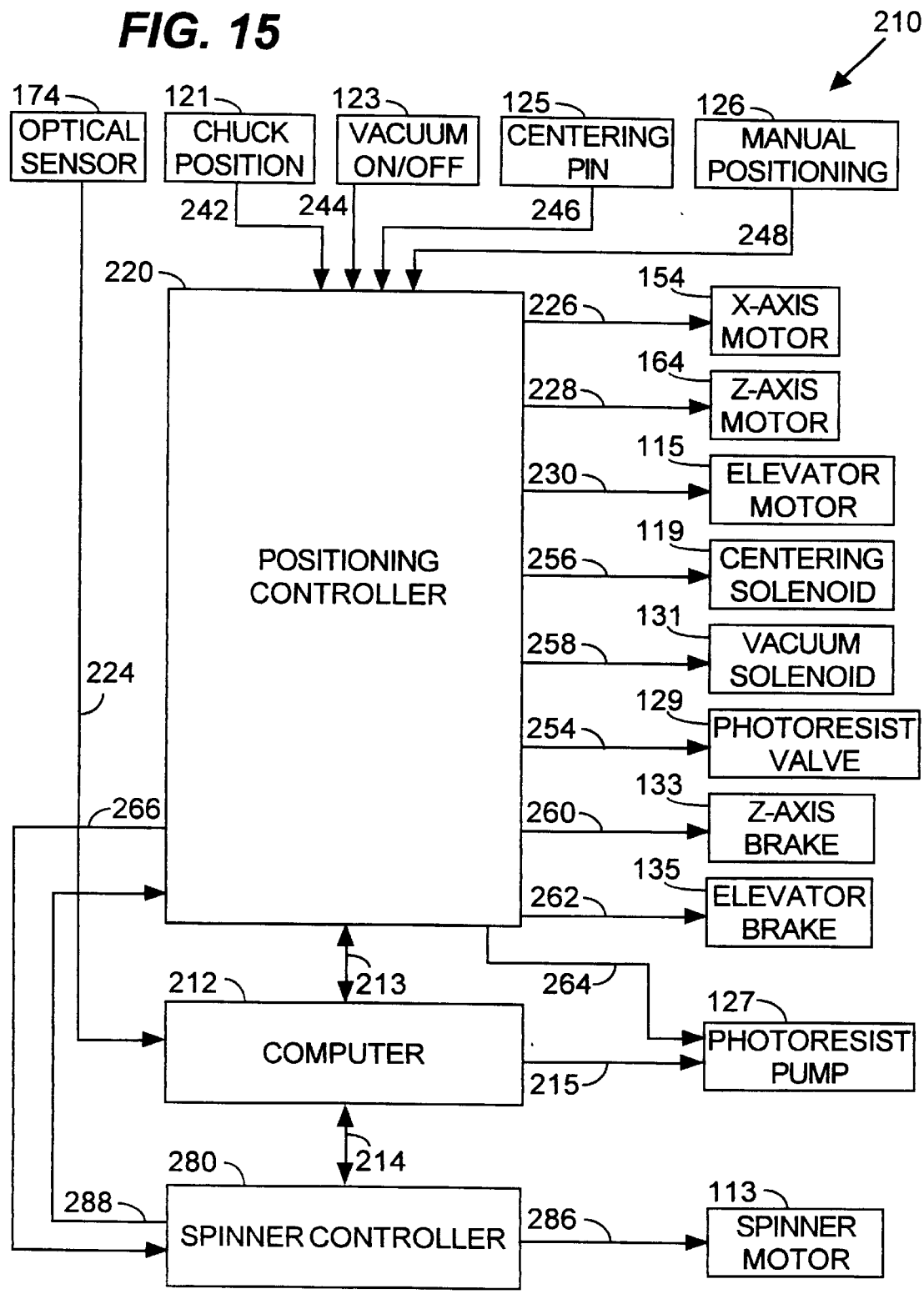
FIG. 15 is a block diagram of an embodiment of a control system in the extrusion spin coating assembly of the invention.

Sensors on the coater module 110 indicate chuck 114 vertical home position (not illustrated, reference numeral 121 in FIG. 15), vacuum state (on/off) (not illustrated, reference numeral 123 in FIG. 15), and centering pin position (not illustrated, reference numeral 125 in FIG. 15). These features of the coating module 110 are well known to those skilled in the art and are therefore not illustrated.

A coater module 110 suitable for use with the invention is a 90SE coater module which is commercially available from Silicon Valley Group, Inc. The 90SE coater module is one component of a 90SE Wafer Processing track also commercially available from Silicon Valley Group, Inc.

The positioning system 130 is supported by an aluminum baseplate 132 which is mounted above the coater module 110. The baseplate 132 has a center cut-out 134 positioned over the coater module 110. First and second vertical support plates 134, 136 mounted above the baseplate support a cross-support 137 on which a two-axis positioning system 150 is mounted. The positioning system 150 includes an x-axis positioning table 152 and a z-axis positioning table 162. The x-axis positioning table 152 includes an x-axis table motor 154 and x-axis table base 156. Likewise, the z-axis positioning table 162 includes a z-axis table motor 164 and z-axis table base 166. The z-axis positioning table 162 also includes a z-axis brake 160. The z-axis positioning table 162 is mounted on the carriage 158 of the x-axis positioning table 152. The x-axis positioning table 152 moves in a horizontal plane, parallel to the surface 51 of a wafer 50 mounted on the chuck 114, and the z-axis positioning table 162 moves in a vertical direction perpendicular to the plane of the surface 51 of a wafer 50 mounted on the chuck 114. A positioning system suitable for use in the x-axis and z-axis positioning tables 152, 162 of the invention is the Parker Daedal Motion Table driven by 5-pitch ball screws.

An extrusion head 30 is mounted at the bottom of an aluminum extrusion head support 172 which, in turn, is mounted on the z-axis positioning table 162. The z-axis positioning table 162 has sufficient range of motion to move the extrusion head 30 from a position above the base plate 132, down, through the center cut-out 134 in the baseplate 132, to the proximity of a wafer 50 on the chuck 114.

An optical sensor 174 is mounted on the extrusion head support 172. The optical sensor 174 is used to measure the gap between the extrusion head 30 and a wafer 50 mounted on the chuck 114. A sensor suitable for use in an embodiment of the invention is a Philtec RC140L reflectance compensated optical displacement sensor. The optical sensor 174 shines a light on the surface of the wafer 50, measures the reflected light, and generates a voltage proportional to the intensity of the measured light. The spot size of the Philtec sensor is 6 mm and has a bandwidth from DC to 100 Hz. The voltage-distance curve of the Philtec sensor is generally non-linear, but has a linear region when the sensor-wafer distance is between, for example, 5.51 and 6.17 mm (0.217 and 0.243 inch). The optical sensor 174 is positioned on the extrusion head support 172 so that all measurements fall within the linear range of the optical sensor 174.

Means for controlling flow of the photoresist includes a photoresist pump (not illustrated) and a photoresist shutoff valve 129. Such arrangements are well known to those skilled in the art, and therefore is not fully illustrated in FIGS. 12, 13 or 14. However, the following description of the control system 210 of the extrusion spin coating assembly 100 includes reference to the photoresist pump (not illustrated, reference numeral 127 in FIG. 15) and the photoresist shutoff valve 129.

FIG. 15 is a block diagram which illustrates an embodiment of a control system 210 suitable for controlling the extrusion spin coating assembly 100 of the invention. The control system 210 includes a computer 212, a positioning controller 220 and a spinner controller 280. The computer 212 downloads programs to the positioning controller 220, the spinner controller 280 and the photoresist dispense pump 127 via serial interfaces 213, 214, 215. The positioning controller 220 sends commands to the photoresist dispense pump 127 to start and stop photoresist flow and to control the photoresist shutoff valve 129. The positioning controller 220 also controls the position of the x-axis positioning table 152 via the x-axis motor 154 and z-axis positioning table 162 via the z-axis motor 164, and the chuck elevator servomotor 115. The positioning controller 220 receives the output of the optical sensor 174, calculates the distance between the extrusion head 30 and the wafer 50, and uses the results to control the z-axis positioning table 162 via the z-axis motor 164.

A computer suitable for use in the control system 210 is an IBM-compatible PC. Suitable for use as the positioning controller 220 is the Parker Compumotor AT6450 Servo Controller, including the optional ANI analog input PC card and the AUX board. Suitable for use as the spinner controller 280 is The Pacific Scientific SC 755. Although the computer 212, positioning controller 220 and spinner controller 280 are shown separately in the block diagram of FIG. 15, in an embodiment which includes the Parker Compumotor AT6450 and Pacific Scientific SC755 controllers, the Compumotor AT6450 plugs into the motherboard of the PC. The invention also contemplates an embodiment in which both the positioning controller 220 and spinner controller 280 functions are provided by a single, combined controller.

The positioning controller 220 includes a positioning controller processor and several inputs and outputs. The inputs and outputs include a 14-bit analog to digital (A/D) converter, several discrete digital inputs and outputs, and servomotor outputs (the processor and inputs and outputs are well known to those skilled in the art and are not individually illustrated). The output of the optical sensor 174 is coupled to the A/D converter input 224. The positioning controller 220 discrete digital inputs are optically isolated interfaces, and include a chuck position home indicator input 242 coupled to the chuck position home sensor 121; a vacuum on/off status indicator input 244 coupled to the vacuum on/off sensor 123 on the vacuum chuck 114; a centering pin in/out position indicator input 246 coupled to the centering pin position sensor 125; and one or more manual positioning command inputs 248 coupled to operator manual positioning switches 126.

The positioning controller 220 outputs include an x-axis servomotor output 226 which is coupled to the x-axis servomotor 154; a z-axis servomotor output 228 which is coupled to the z-axis servomotor 164; and an elevator motor output 230 which is coupled to the elevator servomotor 115.

The positioning controller 220 discrete digital outputs include a photoresist valve on/off output 254 which is coupled to the photoresist shutoff valve 129; a centering solenoid output 256 which is coupled to the centering solenoid 119 which controls the centering pins 138; a vacuum solenoid output 258 which is coupled to the vacuum solenoid 131; a z-axis motor brake output 260 which is coupled to the z-axis brake 133 in the z-axis positioning table 162; an elevator motor brake output 262 which is coupled to the elevator motor brake 135; a trigger output 264 to the photoresist dispense pump 127; and logical outputs 266 to the spinner controller 280.

The spinner controller 280 runs the coating and spin cycles in response to signals received from the positioning controller 220. The spinner controller 280 includes a spinner controller processor, a servomotor output, and an encoder (the processor and encoder are well known to those skilled in the art and are not individually illustrated). The spinner controller 280 outputs include a spinner motor output 286 which is coupled to the spinner motor 113. The output of the spinner controller 280 also includes a simulated encoder signal 288 which is coupled to the positioning controller. The simulated encoder signal 288 allows electronic gearing of the spinner motor 113 speed to control the x-axis positioning of the extrusion head 30 performed by the positioning controller 220.

The extrusion head 30 and the positioning tables 152, 162 must be aligned with respect to a wafer 50 mounted on the chuck 114 to obtain reliable coating. Three alignments are required. These alignments will be described with reference to FIGS. 12, 13 and 14. A first alignment adjusts the path of the extrusion slot 39 so that the extrusion slot 39 passes directly over the center of a wafer 50 mounted on the chuck 114. This alignment is needed to completely cover the center area of the wafer 50. The extrusion head 30 is positioned over the center of the wafer 50 by sliding the vertical support plates 134, 136 forward or backward over the base plate 132. The motion of the vertical support plates 134, 136 is constrained by a guide on the base plate 132. Adjustment bolts at the rear of each of the vertical support plates 134, 136 allow fine tuning of the position of the vertical support plates 134, 136 before the vertical support plates 134, 136 are fastened into place.

The second alignment adjusts the angle of the x-axis with respect to the wafer surface 51. This alignment maintains a constant gap between the wafer 50 and the extrusion head 30 as the x-axis positioning table 152 changes position. The angle of the x-axis with respect to the wafer surface 51 can be changed by rotating the cross-support 137 about a first pivot 179 at one end of the cross-support 137. Fine and coarse adjustment bolts 184, 186 allow adjustments of the angle between the x-axis and the wafer surface 51 of $1.64 \times 10^{-5}$ radians per turn of the fine adjustment bolt 184. The angle of the x-axis with respect to the wafer surface 51 can be determined by scanning across the wafer surface 51 with the optical sensor 174. During the scan, with the z-axis fixed, measurements of the optical sensor 174 output and the x-position are recorded. A linear regression of these data pairs provides the angle between the wafer surface 51 and the x-axis.

The third alignment adjusts the bottom edge of the extrusion head 30, i.e. the extrusion slot 39, until it is parallel with the x-axis and the wafer surface 51. This alignment is crucial for maintaining a constant gap across the width of the extrusion head 30. The angle between the bottom edge of the extrusion head 30 and the x-axis can be adjusted using a wafer-extruder parallelism adjustment bolt 176. The wafer-extruder parallelism adjustment bolt 176 pivots the extrusion head support 172 about a wafer-extruder parallelism adjustment pivot 178 at the base of the z-axis positioning table 162. The angle between the x-axis and the bottom of the extrusion head 30 can be measured using a linear variable differential transformer (LVDT) sensor. The LVDT sensor is secured to the wafer surface 51 with the measurement tip pointing vertically up. Next, the extrusion head 30 is lowered until the lips 41, 42 of the extrusion head 30 move the LVTD sensor to a reference position. After the x-axis and z-axis positioning table 152, 162 positions are recorded, the procedure is repeated for several other positions along the extrusion head lips 41, 42. The slope of the extrusion head 30 with respect to the x-axis is determined using a linear regression of these data pairs.

The optical sensor 174 may be calibrated in a two-step process. First, a voltage offset (i.e., zero-gap bias) voltage is determined by measuring the output voltage of the optical sensor 174 at several small gap distances using precision shims placed between the extrusion head 30 and the wafer surface 51. A linear regression analysis of the gap distance and sensor voltage data is used to calculate the voltage offset (i.e., sensor voltage at a zero gap). Second, the relationship of the sensor voltage and the height of the extrusion slot 39, in the linear range of the optical sensor 174, is determined by raising the extrusion slot 39 in selected increments (e.g., 10 encoder counts equals 12.7 $\mu$m) and recording the sensor voltage at each position. A linear regression of the data pair provides the slope of the curve representing sensor voltage versus z-axis position of the extrusion slot 39. The extrusion head 30 must be aligned with respect to the x-axis and wafer surface, as described above, prior to calibrating the optical sensor 174 so that errors will not arise from the angle between the extrusion head 30 and the wafer surface 51.

The extrusion spin coating process will be described with reference to FIGS. 16–19. The alignment and calibration procedures described above may be performed periodically or prior to a series of runs as determined to be necessary based on experience with the equipment used.

Figure 16:
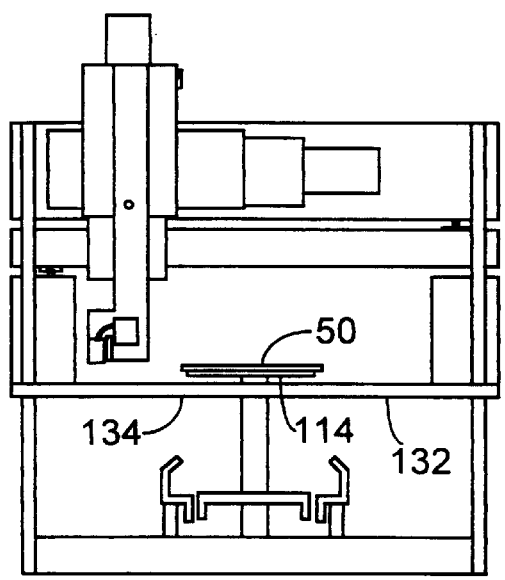
FIGS. 16, 17, 18 and 19 illustrate the configuration of an extrusion spin coating assembly during several steps of the extrusion spin coating process of the invention.
Figure 17:
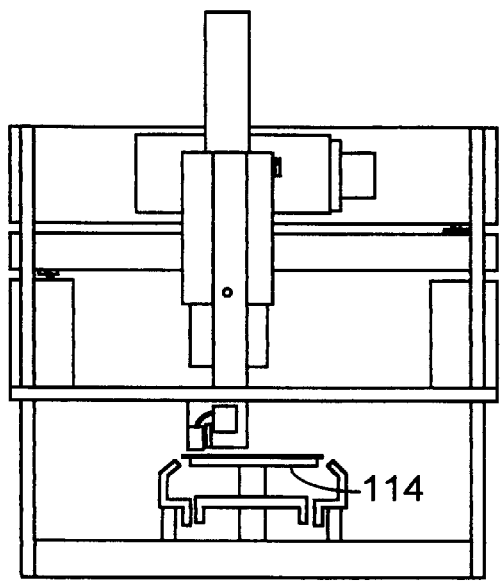
Figure 18:
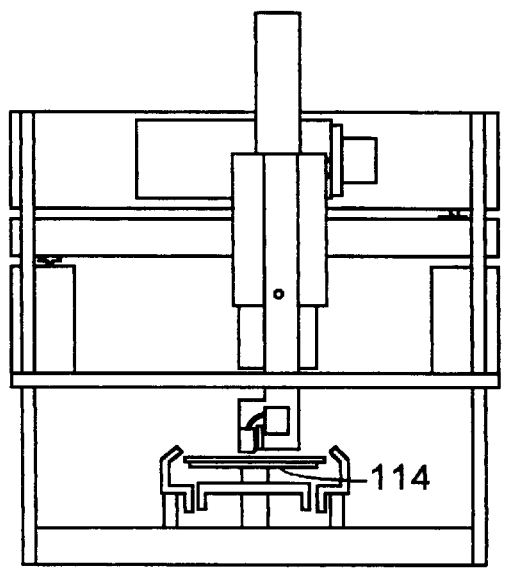

Referring to FIG. 16, the vacuum chuck 114 is raised through the cut out 134 in the base plate 132, and the wafer 50 is placed on the chuck 114. The wafer 50 is centered on the chuck 114 using the centering pins 138 (FIG. 13). The chuck vacuum (not illustrated) is turned on to secure the wafer 50. The chuck 114 is lowered, lowering the wafer 50 into the coating position, and the extrusion head 30 is lowered into position at the edge of the wafer 50 with the desired gap between the wafer 50 and the extrusion head lips 41, 42 as illustrated in FIG. 17. The chuck 114 is then rotated at an initial rotational speed which is the desired coating speed. The photoresist shutoff valve 129 is opened and the photoresist pump 127 is triggered to begin dispensing photoresist. The extrusion head 30 is moved radially with respect to the wafer 50. As the extrusion head 30 moves toward the center of the wafer 50, the rotational speed of the chuck 114 is increased and the extrusion head speed is increased at a rate proportional to the increase in the rotational speed in order to maintain the coating speed of the extrusion head 30 over the wafer 50 constant. When the leading edge of the extrusion head 30 reaches the center of the wafer 50, illustrated in FIG. 18, the speed of rotation of the wafer 30 is held constant until the trailing edge of the extrusion head 30 reaches the center of the wafer 50. When the entire wafer 50 is covered with photoresist, the photoresist pump 127 is triggered to stop dispensing photoresist, and the photoresist shutoff valve 129 is closed. Typically, it is necessary to continue extruding photoresist and continue moving the extrusion head 30 until the trailing edge of the extrusion head 30 reaches the center of the wafer 50 in order to cover the entire wafer 50 with photoresist. When the photoresist pump 127 and shutoff valve 129 are triggered to stop dispensing photoresist, a residual amount of photoresist which is already in the extrusion head 30 (and possibly also in tubing leading to the extrusion head 30) may continue to flow and be deposited on the wafer 50. In such cases, the photoresist pump 127 and shutoff valve 129 may be triggered to stop dispensing photoresist a short time prior to covering the entire wafer 50, thereby allowing such residual photoresist to finish covering the wafer 50.

Figure 19:
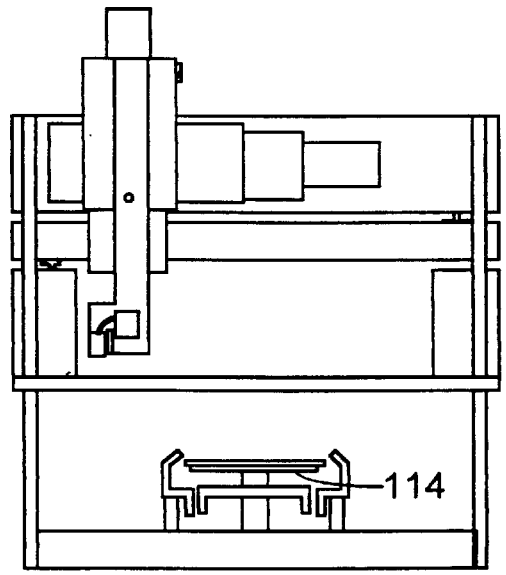

The chuck 114 then lowers the wafer 50 into the catch cup 116, and the extrusion head 30 is raised from the coating area as illustrated in FIG. 19. The wafer 50 is then spun at high speed to remove excess photoresist and achieve the desired coating uniformity. The chuck 114 stops spinning and is raised through the center cut out 134 in the base plate 132. The vacuum is turned off and the wafer 50 removed from the chuck 114.

Figure 20:
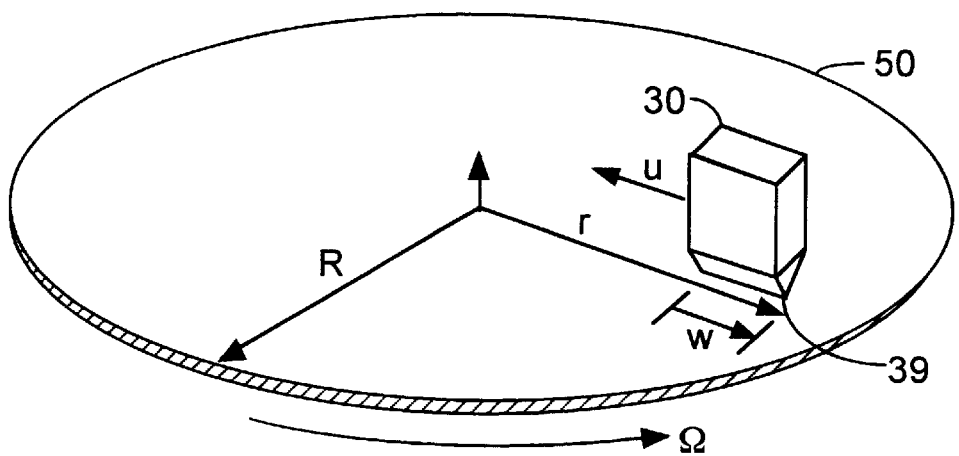
FIG. 20 is a diagram which illustrates certain parameters of extrusion spin coating motion according to the invention.

FIG. 20 is a diagram which illustrates certain parameters of extrusion spin coating motion according to the invention. In FIG. 20, a wafer 50, has a radius R, and is rotating about its center at an angular velocity of $\Omega$. An extrusion head 30 is above the wafer 50, with the extrusion slot 39 radially aligned with respect to the wafer 50. The extrusion slot 39 has a width w, and is moving radially with respect to the wafer 50 at a velocity u. The distance between the center of the wafer 50 and the trailing edge of the extrusion head 30 is r.

The tangential velocity of any point on the surface of the wafer 50, at a distance r from the axis of rotation shown in FIG. 20 is:

$$v = \Omega r$$

With the trailing edge of the extrusion head 30 at a distance r from the axis of rotation, a spiral extrusion pattern can be made by moving the extrusion head 30 inward one length of the extrusion slot 39 for each revolution of the wafer 50, The extrusion head 30 speed along the diameter of the wafer 50 is then:

$$u = \frac{\Omega w}{2\pi}$$

Solving for $\Omega$ and substituting yields:

$$u = \frac{wv}{2\pi r}$$

For radially inward motion, u=−dr/dt, and a differential equation for the position of the extrusion head can be obtained as follows:

$$\frac{dr}{dt} = -\frac{wv}{2\pi r}$$

Integrating this equation using the initial condition r=r$_0$ at time t=0 yields:

$$r = \left(r_0^2 - \frac{wvt}{\pi}\right)^{1/2}$$

The wafer rotation speed can be expressed as a function of time as:

$$\Omega = \frac{v}{\left(r_0^2 - \frac{wvt}{\pi}\right)^{1/2}}$$

and the head speed can be expressed as a function of time as:

$$u = \frac{wv}{2\Pi\left(r_0^2 - \frac{wvt}{\pi}\right)^{1/2}}$$

Figure 21:
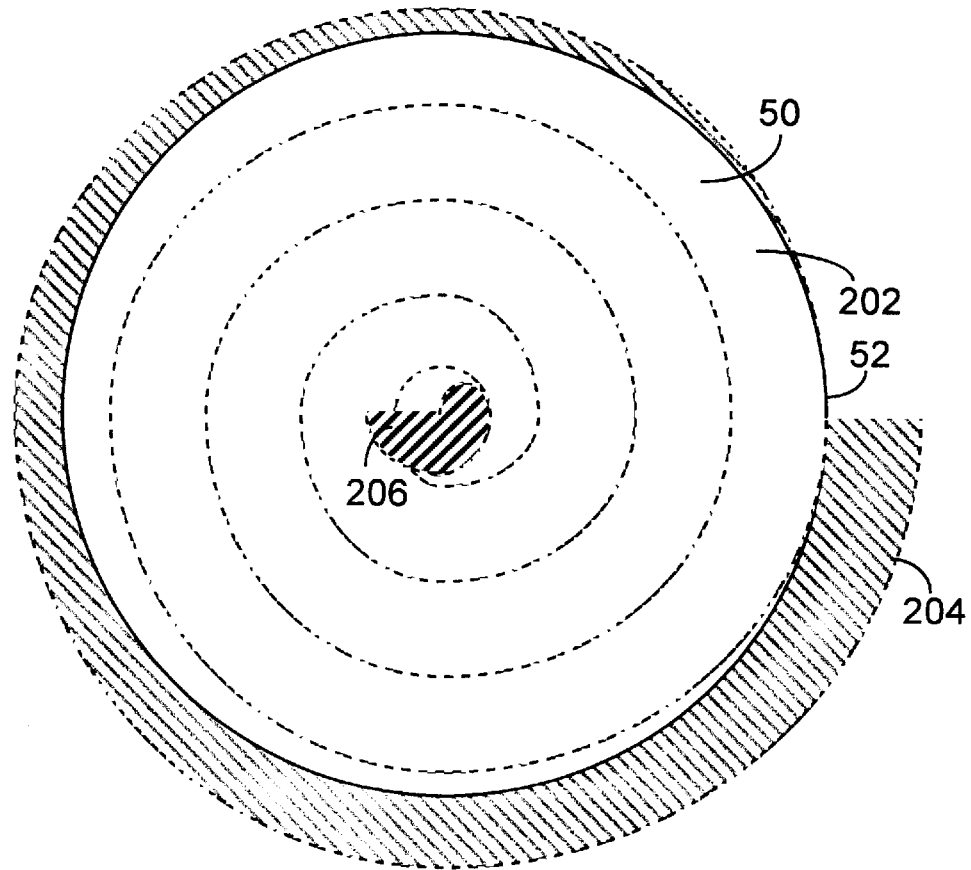
FIG. 21 illustrates an extrusion spin coating spiral pattern according to the invention.

FIG. 21 illustrates an extrusion spin coating spiral pattern 202 according to one aspect of the invention. The spiral pattern 202 results from the extrusion head 30 starting at the outer edge 52 of the wafer 50 and moving radially inward toward the center of the wafer 50. A first shaded region 204 represents wasted photoresist at the outer edge of the wafer 50, and a second shaded region 206 represents a double thickness of photoresist extruded in the center region of the wafer 50. It is necessary to start the process with the extrusion head 50 just off the outer edge 52 of the wafer 50 to cover the entire outer edge 52 with the extruded spiral pattern 202 without unnecessary overlap or double thickness around the outer edge 52 of the wafer 50. This results in the first shaded region 204 of wasted photoresist. Likewise, it is necessary to continue to extrude photoresist after the leading edge of the extrusion head 30 reaches the center of the wafer 50 until the entire wafer 50 is covered. Typically, it will be necessary to continue the process until the trailing edge of the extrusion head 30 reaches the center to cover the entire center region of the wafer 50. The overlap in the second shaded region 206 at the center of the wafer 50 is inevitable because of the finite width of the extrusion head 30. However, the amount of wasted and excess photoresist is relatively small, and the efficiency of the extrusion spin coating process far exceeds the efficiency of prior spin coating processes.

FIG. 21 illustrates an extrusion spin coating spiral pattern which results from starting the extrusion head at the outer edge of the wafer and, while spinning the wafer, moving the extrusion head radially inward toward the center of the wafer. The method and apparatus of the invention may instead start the extrusion head at the center of the wafer and move the extrusion head radially outward toward the outer edge of the wafer.

It will be readily apparent to those skilled in the art that this invention is not limited to the embodiments described above. Different configurations and embodiments can be developed without departing from the scope of the invention and are intended to be included within the scope of the claims.

The invention claimed is:

1. A method of applying a coating of photoresist to a circular semiconductor wafer, the wafer having a top surface, a center, and an outer edge, the method comprising extruding a ribbon of photoresist, the ribbon having a width, the ribbon covering the entire top surface of the wafer in a spiral pattern, wherein the photoresist is extruded from the extrusion slot at a rate which is a constant extrusion rate, and with the wafer rotating at a rotational speed, and the extrusion head moving at a radial speed, the motion of a radially moving extrusion head with respect to the rotating wafer is at a tangential velocity which is a constant tangential velocity.

2. A method according to claim 1, wherein the ribbon of photoresist is extruded in a spiral pattern beginning at the outer edge of the wafer and ending at the center of the wafer.

3. A method according to claim 1, wherein the ribbon of photoresist is extruded in a spiral pattern beginning at the center of the wafer and ending at the outer edge of the wafer.

4. A method according to claim 1, wherein the width of the photoresist ribbon is between about one tenth and about one third of the diameter of the semiconductor wafer.

5. A method of applying a coating of photoresist to a circular semiconductor wafer, the wafer having a top surface, a center, a diameter, and an outer edge, the method comprising the steps of (a) mounting the wafer on a chuck, the top surface of the wafer aligned horizontally and oriented upward, (b) positioning an extrusion head adjacent to the outer edge of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the first end of the extrusion slot located adjacent to the outer edge of the wafer, and the second end of the extrusion slot outside the outer edge of the wafer, (c) rotating the wafer about its center, wherein with the wafer rotating at a rotational speed, and the extrusion head moving at a radial speed, the motion of a radially moving extrusion head with respect to the rotating wafer is at a tangential velocity which is a constant tangential velocity.

(d) extruding a ribbon of photoresist from the extrusion slot, the ribbon having a width which is substantially equal to the length of the slot, wherein the photoresist is extruded from the extrusion slot at a rate which is a constant extrusion rate, and (e) while extruding photoresist from the extrusion slot, and maintaining the extrusion slot aligned radially with respect to the wafer, moving the extrusion head radially inward from the outer edge of the wafer toward the center of the wafer until the photoresist covers the entire top of the surface of the wafer.

6. A method according to claim 5, wherein the length of the extrusion slot is between about one tenth and one third of the diameter of the semiconductor wafer.

7. A method according to claim 5, wherein step (e) comprises uniformly maintaining the extrusion slot at a distance above the top surface of the wafer.

8. A method according to claim 7, wherein step (e) comprises determining a distance between the extrusion slot and the top surface of the wafer, and adjusting the position of the extrusion slot to maintain the distance.

9. A method according to claim 8, wherein step (e) comprises determining a distance between the extrusion slot and the top surface of the wafer using an optical sensor.

10. A method according to claim 5, wherein the photoresist ribbon is coated onto the wafer in a spiral pattern which covers the entire top surface of the wafer.

11. A method according to claim 5, comprising the steps of (f) removing the extrusion head, and (g) rotating the wafer at high speed.

12. A method of applying a coating of photoresist to a circular semiconductor wafer, the wafer having a top surface, a center, a diameter, and an outer edge, the method comprising the steps of (a) mounting the wafer on a chuck, (b) positioning an extrusion head at the center of the wafer and above the top surface of the wafer, the extrusion head configured to extrude photoresist out an extrusion slot, the extrusion slot having a length bounded by a first end and a second end, the extrusion head positioned with the extrusion slot aligned radially with respect to the wafer, the first end of the extrusion slot located at the center of the wafer and the second end of the extrusion slot located between the center of the wafer and the outer edge of the wafer, (c) rotating the wafer about its center wherein with the wafer rotating at a rotational speed, and the extrusion head moving at a radial speed, the motion of a radially moving extrusion head with respect to the rotating wafer is at a tangential velocity which is a constant tangential velocity, (d) extruding a ribbon of photoresist from the extrusion slot, the ribbon having a width substantially equal to the length of the slot, wherein the photoresist is extruded from the extrusion slot at a rate which is a constant extrusion rate, and (e) while extruding photoresist from the extrusion slot, and maintaining the extrusion slot aligned radially with respect to the wafer, moving the extrusion head radially outward toward the outer edge of the wafer until the photoresist covers the entire top surface of the wafer.

* * * * *

UNITED STATES PATENT AND TRADEMARK OFFICE
CERTIFICATE OF CORRECTION

PATENT NO. : 6,191,053
DATED : February 20, 2001
INVENTOR(S) : Chun et al.

Page 1 of 1

It is certified that error appears in the above-identified patent and that said Letters Patent is hereby corrected as shown below:

(73) Assignee: Massachusetts Institute of Technology, Cambridge, MA (US)

Signed and Sealed this

Fifth Day of June, 2001

*Attest:*

*Attesting Officer*

NICHOLAS P. GODICI

*Acting Director of the United States Patent and Trademark Office*